US007616120B1

(12) United States Patent
Humes et al.

(10) Patent No.: US 7,616,120 B1
(45) Date of Patent: Nov. 10, 2009

(54) MULTIPLE RF-PORT MODULATOR FOR RFID TAG

(75) Inventors: Todd E. Humes, Seattle, WA (US); Ronald A. Oliver, Seattle, WA (US)

(73) Assignee: Impinj, Inc., Seattle, WA (US)

( * ) Notice: Subject to any disclaimer, the term of this patent is extended or adjusted under 35 U.S.C. 154(b) by 400 days.

(21) Appl. No.: 11/712,759

(22) Filed: Feb. 28, 2007

(51) Int. Cl.
*G08B 13/14* (2006.01)
*H01L 21/336* (2006.01)

(52) U.S. Cl. .............. 340/572.1; 340/572.7; 438/197; 438/198; 438/199; 257/213; 257/499

(58) Field of Classification Search ........................ None
See application file for complete search history.

(56) References Cited

U.S. PATENT DOCUMENTS

| | | | |
|---|---|---|---|
| 4,584,709 A | 4/1986 | Kneisel et al. | |
| 4,730,188 A | 3/1988 | Milheiser | |
| 4,742,567 A | 5/1988 | Ohe et al. | |
| 4,953,157 A | 8/1990 | Franklin et al. | |
| 4,977,616 A | 12/1990 | Linder et al. | |
| 5,142,292 A | 8/1992 | Chang | |
| 5,430,441 A | 7/1995 | Bickley et al. | |
| 5,448,110 A | 9/1995 | Tuttle et al. | |
| 5,499,397 A | 3/1996 | Wadin et al. | |
| 5,507,035 A | 4/1996 | Bantz et al. | |
| 5,572,226 A | 11/1996 | Tuttle | |
| 5,719,586 A | 2/1998 | Tuttle | |
| 5,771,021 A | 6/1998 | Veghte et al. | |
| 5,842,118 A | 11/1998 | Wood, Jr. | |
| 6,057,803 A | 5/2000 | Kane et al. | |
| 6,078,259 A | 6/2000 | Brady et al. | |
| 6,078,791 A | 6/2000 | Tuttle et al. | |
| 6,130,570 A | 10/2000 | Pan et al. | |
| 6,147,605 A | 11/2000 | Vega et al. | |
| 6,249,260 B1 | 6/2001 | Holloway | |
| 2004/0179391 A1* | 9/2004 | Bhattacharyya | 365/149 |
| 2006/0055620 A1 | 3/2006 | Oliver et al. | |
| 2007/0122960 A1* | 5/2007 | Aoki | 438/197 |
| 2007/0207575 A1* | 9/2007 | Taniguchi et al. | 438/199 |
| 2008/0001258 A1* | 1/2008 | Ema et al. | 257/607 |
| 2008/0227248 A1* | 9/2008 | Han | 438/199 |

OTHER PUBLICATIONS

Masui, "A 13.56 MHz CMOS RF Identification Passive Tag LSI with Ferroelectric Random Access Memory", *IEICE Transactions on Electronics* E88-C(4), (2005),IEICE Transactions on Electronics.

* cited by examiner

*Primary Examiner*—Julie Lieu
(74) *Attorney, Agent, or Firm*—Turk IP Law, LLC

(57) ABSTRACT

Apparatus and systems may include integrated circuits for use with Radio Frequency Identification (RFID) tags having an antenna structure with at least three coupling ends. The integrated circuits may include three or more nodes corresponding respectively to the at least three coupling ends, and a modulator switch to receive a single modulator switching signal input. Methods may include those used to form and operate such circuits. Additional apparatus, systems, and methods are disclosed.

19 Claims, 11 Drawing Sheets

RFID SYSTEM

RFID TAG

*RFID TAG COMPONENTS*

*SIGNAL PATH DURING R→T*

*SIGNAL PATH DURING T→R*

*RFID TAG WITH RECTANGULAR ANTENNAS*

*RFID TAG WITH SINGLE MODULATOR
AND TWO ANTENNAS*

RFID TAG WITH 3+ ANTENNA PORTS

*DETAIL OF CHIP WITH ANTENNA MOUNT*

MULTIPLE RF-PORT MODULATOR FOR RFID TAG

TECHNICAL FIELD

The information in this document is related to modulation devices, including apparatus, systems, and methods that operate to modulate electronic signals and provide them to multiple output ports.

BACKGROUND INFORMATION

Radio Frequency IDentification (RFID) systems typically include RFID tags and RFID readers (the latter are also known as RFID reader/writers or RFID interrogators). RFID systems can be used in many ways for locating and identifying objects to which the tags are attached. RFID systems are particularly useful in product-related and service-related industries for tracking large numbers of objects being processed, inventoried, or handled. In such cases, an RFID tag is usually attached to an individual item, or to its package.

In principle, RFID techniques entail using an RFID reader to interrogate one or more RFID tags. The reader transmitting a Radio Frequency (RF) wave performs the interrogation. A tag that senses the interrogating RF wave responds by transmitting back another RF wave. The tag generates the transmitted back RF wave either originally, or by reflecting back a portion of the interrogating RF wave in a process known as backscatter. Backscatter may take place in a number of ways.

The reflected-back RF wave may further encode data stored internally in the tag, such as a number. The response is demodulated and decoded by the reader, which thereby identifies, counts, or otherwise interacts with the associated item. The decoded data can denote a serial number, a price, a date, a destination, other attributes, any combination of attributes, and so on.

An RFID tag typically includes an antenna system, a power management section, a radio section, and frequently a logical section, a memory, or both. In earlier RFID tags, the power management section included an energy storage device, such as a battery. RFID tags with an energy storage device are known as active tags. Advances in semiconductor technology have miniaturized the electronics so much that an RFID tag can be powered solely by the RF signal it receives. Such RFID tags do not include an energy storage device, and are called passive tags.

RFID tags may be attached to almost any part of an item, or the package for an item. After attaching the tags, individual items may be grouped with similar items in a variety of arrangements, or even in a random manner. The end result may be that the antenna orientation for individual RFID tags within a given RFID system is unknown. Since the orientation of the antenna for a particular RFID tag may affect its operational integrity, apparatus, systems, and methods are needed to improve the communication performance (e.g., orientation sensitivity and overall system robustness) of RFID systems comprising multiple RFID tags with unknown antenna orientations.

DETAILED DESCRIPTION

The challenges noted above may be addressed by using circuitry that includes a single modulator capable of driving multiple antennas. For example, in some cases, the circuitry may be embodied as an integrated circuit chip that includes an antenna structure with three or more coupling ends, and a modulator switch with multiple switching terminals coupled to the coupling ends. The circuitry may also be embodied as an RFID tag with an antenna structure having three or more coupling ends, and a circuit to drive the antenna structure that includes a plurality of transistors having a common gate connection. Related semiconductor devices, and processes/methods/articles to form such devices, including integrated circuits, capable of driving similar antenna structures are also described.

Figure 1:
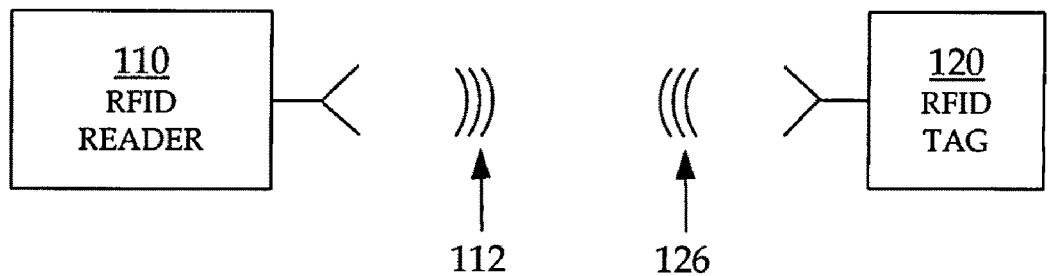
FIG. 1 is a block diagram of components of an RFID system, according to various embodiments of the invention.

FIG. 1 is a diagram of components of a typical RFID system 100, incorporating aspects of various embodiments of the invention. An RFID reader 110 transmits an interrogating Radio Frequency (RF) wave 112. RFID tag 120 in the vicinity of RFID reader 110 may sense interrogating RF wave 112, and generate wave 126 in response. RFID reader 110 senses and interprets wave 126.

Reader 10 and tag 120 exchange data via wave 112 and wave 126. In a session of such an exchange, each encodes, modulates, and transmits data to the other, and each receives, demodulates, and decodes data from the other. The data is modulated onto, and decoded from, RF waveforms.

Encoding the data in waveforms can be performed in a number of different ways. For example, protocols are devised to communicate in terms of symbols, also called RFID symbols. A symbol for communicating can be a delimiter, a calibration symbol, and so on. Further symbols can be implemented for ultimately exchanging binary data, such as "0" and "1", if that is desired. In turn, when the waveforms are processed internally by reader 110 and tag 120, they can be equivalently considered and treated as numbers having corresponding values, and so on.

Tag 120 can be a passive tag or an active tag, i.e. having its own power source. Where tag 120 is a passive tag, it is powered from wave 112.

Figure 2:
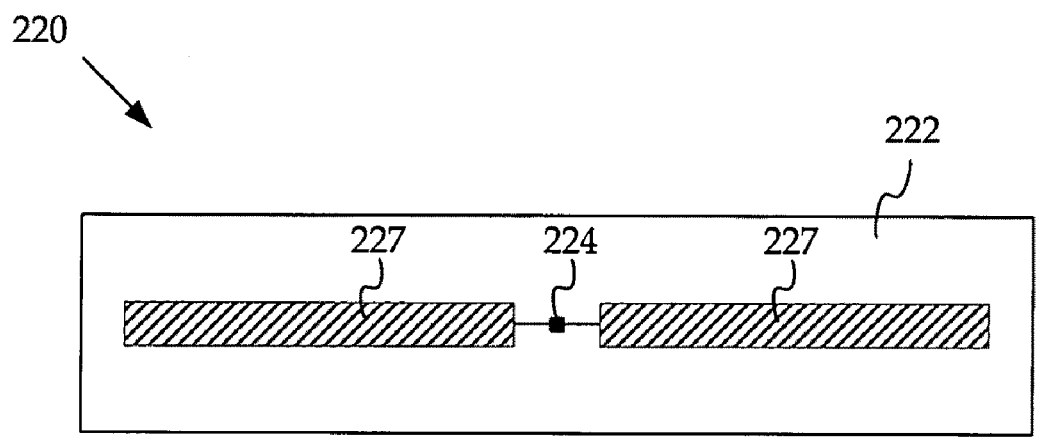
FIG. 2 is a diagram showing components of a passive RFID tag, including a tag that can be used in the system of FIG. 1, according to various embodiments of the invention.

FIG. 2 is a diagram of an RFID tag 220, which can be the same as tag 120 of FIG. 1. Tag 220 is implemented as a passive tag, meaning it does not have its own power source. Much of what is described in this document, however, applies also to active tags.

Tag 220 is formed on a substantially planar inlay 222, which can be made in many ways known in the art. Tag 220 includes an electrical circuit, which is preferably implemented in an integrated circuit (IC) 224. IC 224 is arranged on inlay 222.

Tag 220 also includes an antenna for exchanging wireless signals with its environment. The antenna is usually flat and attached to inlay 222. IC 224 is electrically coupled to the antenna via suitable antenna ports (not shown in this figure).

The antenna may be made in a number of ways, as is well known in the art. In the example of FIG. 2, the antenna is made from two distinct antenna segments 227, which are shown here forming a dipole. Many other embodiments are possible, using any number of antenna segments.

In some embodiments, an antenna can be made with even a single segment. Different locations on the segment can be coupled to one or more of the antenna ports of IC 224. For example, the antenna can form a single loop, with its ends coupled to the ports. When the single segment has more complex shapes, it should be remembered that, at the frequencies of RFID wireless communication, even a single segment could behave like multiple segments.

In operation, a signal is received by the antenna, and communicated to IC 224. IC 224 both harvests power, and responds if appropriate, based on the incoming signal and its internal state. In order to respond by replying, IC 224 modulates the reflectance of the antenna, which generates the backscatter from a wave transmitted by the reader. Coupling together and uncoupling the antenna ports of IC 224 can modulate the reflectance, as can a variety of other means.

In the embodiment of FIG. 2, antenna segments 227 are separate from IC 224. In other embodiments, antenna segments may alternately be formed on IC 224, and so on.

The components of the RFID system 100 of FIG. 1 may communicate with each other in any number of modes. One such mode is called full duplex. Another such mode is called half-duplex, and is described below.

Figure 3:
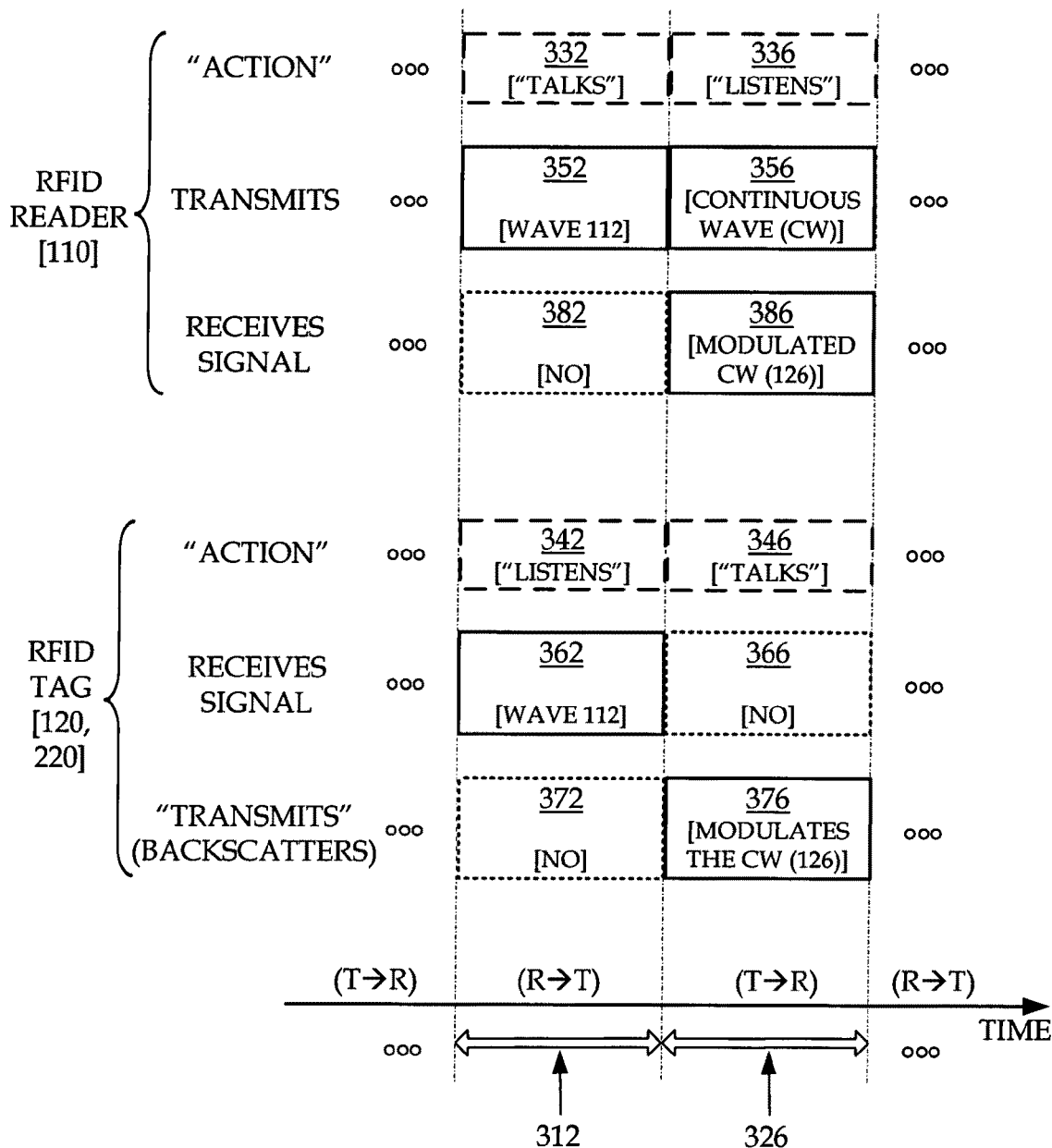
FIG. 3 is a conceptual diagram illustrating a half-duplex mode of communication between the components of the RFID system of FIG. 1, according to various embodiments of the invention.

FIG. 3 is a conceptual diagram 300 for explaining the half-duplex mode of communication between the components of the RFID system of FIG. 1, especially when tag 120 is implemented as passive tag 220 of FIG. 2. The explanation is made with reference to a TIME axis, and also to a human metaphor of "talking" and "listening". The actual technical implementations for "talking" and "listening" are now described.

RFID reader 110 and RFID tag 120 talk and listen to each other by taking turns. As seen on axis TIME, when reader 110 talks to tag 120 the communication session is designated as "R→T", and when tag 120 talks to reader 110 the communication session is designated as "T→R". Along the TIME axis, a sample R→T communication session occurs during a time interval 312, and a following sample T→R communication session occurs during a time interval 326. Of course interval 312 is typically of a different duration than interval 326—here the durations are shown approximately equal only for purposes of illustration.

According to blocks 332 and 336, RFID reader 110 talks during interval 312, and listens during interval 326. According to blocks 342 and 346, RFID tag 120 listens while reader 110 talks (during interval 312), and talks while reader 110 listens (during interval 326).

In terms of actual technical behavior, during interval 312, reader 110 talks to tag 120 as follows. According to block 352, reader 110 transmits wave 112, which was first described in FIG. 1. At the same time, according to block 362, tag 120 receives wave 112 and processes it to extract data, and so on. Meanwhile, according to block 372, tag 120 does not backscatter with its antenna, and according to block 382, reader 110 has no wave to receive from tag 120.

During interval 326, tag 120 talks to reader 110 as follows. According to block 356, reader 110 transmits a Continuous Wave (CW), which can be thought of as a carrier signal that ideally encodes no information. As discussed before, this carrier signal serves both to be harvested by tag 120 for its own internal power needs, and also as a wave that tag 120 can backscatter. Indeed, during interval 326, according to block 366, tag 120 does not receive a signal for processing. Instead, according to block 376, tag 120 modulates the CW emitted according to block 356, so as to generate backscatter wave 126. Concurrently, according to block 386, reader 110 receives backscatter wave 126 and processes it.

Figure 4:
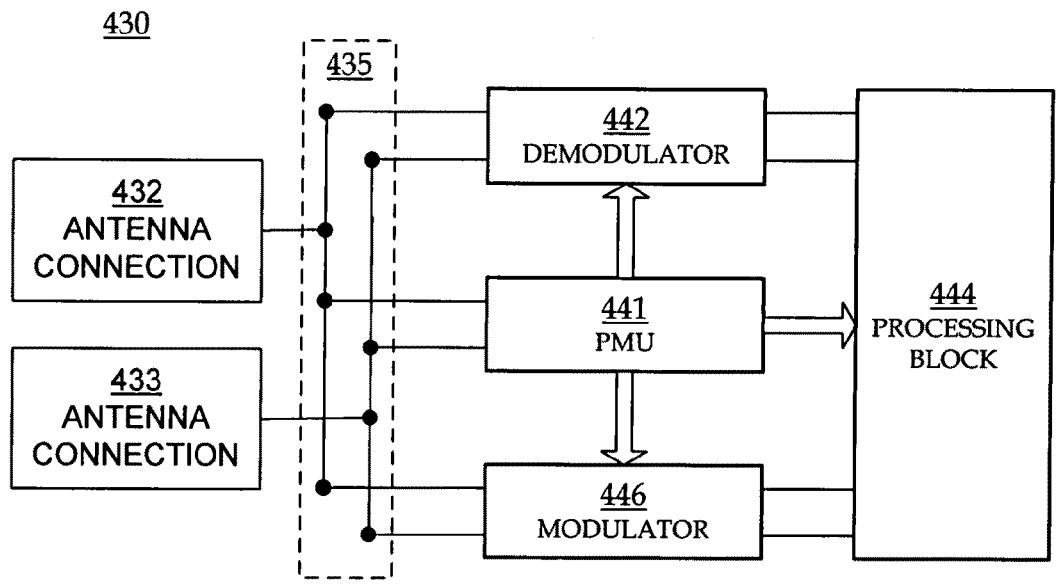
FIG. 4 is a block diagram of an implementation of an electrical circuit that may be formed in an integrated circuit (IC) of the tag of FIG. 2 according to various embodiments of the invention.

FIG. 4 is a block diagram of an electrical circuit 430. Circuit 430 may be formed in an IC of an RFID tag, such as IC 224 of FIG. 2. Circuit 430 has a number of components that are described in this document. Circuit 430 may have a number of additional components from what is shown and described, or different components, depending on the exact implementation.

Circuit 430 includes at least two antenna connections 432, 433, which are suitable for coupling to one or more antenna segments (such as the segments 227 of FIG. 2, not shown in FIG. 4). Antenna connections 432, 433 may be made in any suitable way, such as pads and so on. In a number of embodiments more than two antenna connections are used, especially in embodiments where more antenna segments are used.

Circuit 430 includes a section 435. Section 435 may be implemented as shown, for example as a group of nodes for proper routing of signals. In some embodiments, section 435 may be implemented otherwise, for example to include a receive/transmit switch that can route a signal, and so on.

Circuit 430 also includes a Power Management Unit (PMU) 441. PMU 441 may be implemented in any way known in the art, for harvesting raw RF power received via antenna connections 432, 433. In some embodiments, PMU 441 includes at least one rectifier, and so on.

In operation, an RF wave received via antenna connections 432, 433 is received by PMU 441, which in turn generates power for components of circuit 430. This is true for either or both R→T and T→R sessions, whether or not the received RF wave was modulated.

Circuit 430 additionally includes a demodulator 442. Demodulator 442 demodulates an RF signal received via antenna connections 432, 433. Demodulator 442 may be implemented in any way known in the art, for example including an attenuator stage, amplifier stage, and so on.

Circuit 430 further includes a processing block 444. Processing block 444 receives the demodulated signal from demodulator 442, and may perform operations. In addition, it may generate an output signal for transmission.

Processing block 444 may be implemented in any way known in the art. For example, processing block 444 may include a number of components, such as a processor, a memory, a decoder, an encoder, and so on.

Circuit 430 additionally includes a modulator 446. Modulator 446 modulates an output signal generated by processing block 444. The modulated signal is transmitted by driving antenna connections 432, 433, and therefore driving the load presented by the coupled antenna segment or segments. Modulator 446 may be implemented in any way known in the art, for example including a driver stage, amplifier stage, and so on.

In one embodiment, demodulator 442 and modulator 446 may be combined in a single transceiver circuit. In another embodiment, modulator 446 may include a backscatter transmitter or an active transmitter. In yet other embodiments, demodulator 442 and modulator 446 are part of processing block 444.

It will be recognized at this juncture that circuit 430 can also be the circuit of an RFID reader according to the invention, without needing PMU 441. Indeed, an RFID reader can typically be powered differently, such as from a wall outlet, a battery, and so on. Additionally, when circuit 430 is configured as a reader, processing block 444 may have additional Inputs/Outputs (I/O) to a terminal, network, or other such devices or connections.

In terms of processing a signal, circuit 430 operates differently during a R→T session and a T→R session. The different operations are described below.

Figure 5A:
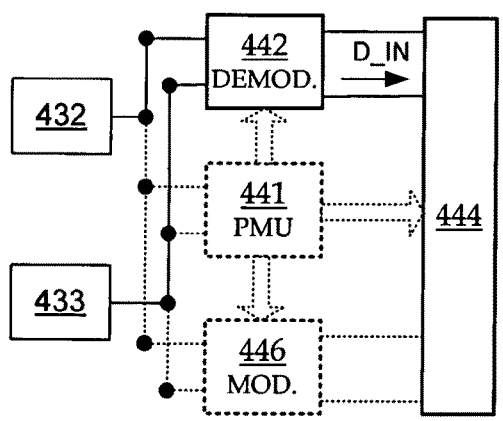
FIG. 5A is the block diagram of FIG. 4, modified to emphasize a signal operation during a R→T session of FIG. 3.

FIG. 5A shows version 530-A of circuit 430 of FIG. 4. Version 530-A shows the components of circuit 430 for a tag, further modified to emphasize a signal operation during a R→T session (receive mode of operation) during time interval 312 of FIG. 3. An RF wave is received from antenna connections 432, 433, a signal is demodulated from demodulator 442, and then input to processing block 444 as D_IN. In one embodiment according to the present invention, D_IN may include a received stream of symbols.

Version 530-A shows as relatively obscured those components that do not play a part in processing a signal during a R→T session. Indeed, PMU 441 may be active, but only in converting raw RF power. And modulator 446 generally does not transmit during a R→T session. Modulator 446 typically does not interact with the received RF wave significantly, either because switching action in section 435 of FIG. 4 decouples the modulator 446 from the RF wave, or by designing modulator 446 to have a suitable impedance, and so on.

While modulator 446 is typically inactive during a R→T session, it need not be always the case. For example, during a R→T session, modulator 446 could be active in other ways. For example, it could be adjusting its own parameters for operation in a future session.

Figure 5B:
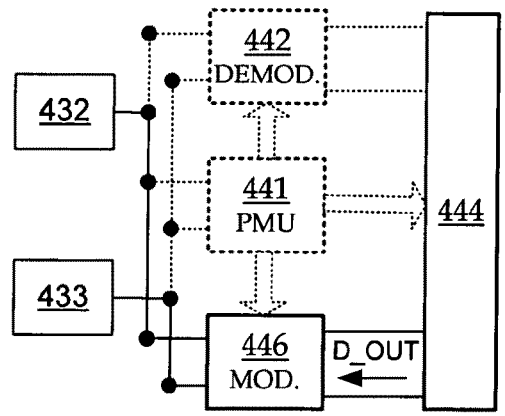
FIG. 5B is the block diagram of FIG. 4, modified to emphasize a signal operation during a T→R session of FIG. 3.

FIG. 5B shows version 530-B of circuit 430 of FIG. 4. Version 530-B shows the components of circuit 430 for a tag, further modified to emphasize a signal operation during a T→R session during time interval 326 of FIG. 3. A signal is output from processing block 444 as D_OUT. In one embodiment according to the present invention, D_OUT may include a transmission stream of symbols. D_OUT is then modulated by modulator 446, and output as an RF wave via antenna connections 432, 433.

Version 530-B shows as relatively obscured those components that do not play a part in processing a signal during a T→R session. Indeed, PMU 441 may be active, but only in converting raw RF power. And demodulator 442 generally does not receive during a T→R session. Demodulator 442 typically does not interact with the transmitted RF wave, either because switching action in section 435 decouples the demodulator 442 from the RF wave, or by designing demodulator 442 to have a suitable impedance, and so on.

While demodulator 442 is typically inactive during a T→R session, it need not be always the case. For example, during a T→R session, demodulator 442 could be active in other ways. For example, it could be adjusting its own parameters for operation in a future session.

From the above, attention is drawn to the question of modulators in general. Those can be sometimes designed in conjunction with what type of antenna system is used. Accordingly, some prior art is presented first.

It is well known to use pairs of antennas spaced at 90 degrees from each other, so as to achieve polarization diversity. An example is discussed below.

Figure 6:
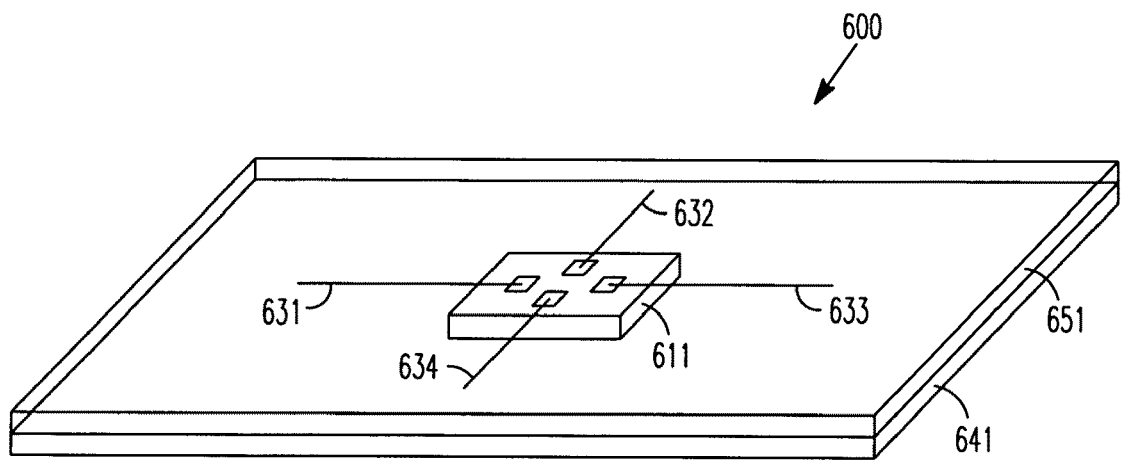
FIG. 6 is a perspective view of a prior art tag having two perpendicular dipole antennas.

FIG. 6 shows a diagram of a tag 600 in the prior art, taken from U.S. Pat. No. 6,078,259. More particularly, FIG. 6 of the present document presents FIG. 3 of U.S. Pat. No. 6,078,259, with some of its elements renumbered for consistency within this document.

Radio frequency tag 600 includes a substrate 641, and a semiconductor circuit 611. Four wires 631, 632, 633, 634 extend from circuit 611. These components are covered by an organic cover 651.

The pairs of wires (631, 633 and 632, 634), which thus form two dipole antennas, are arranged in a different, non parallel direction from each other, preferably perpendicular, so as to maximize the reception and transmission of radio frequency energy in directions perpendicular to each other. This helps eliminate nulls in the reception/transmission pattern.

The challenge of driving pairs of antennas has also been described in the prior art. Two examples are given below.

Figure 7:
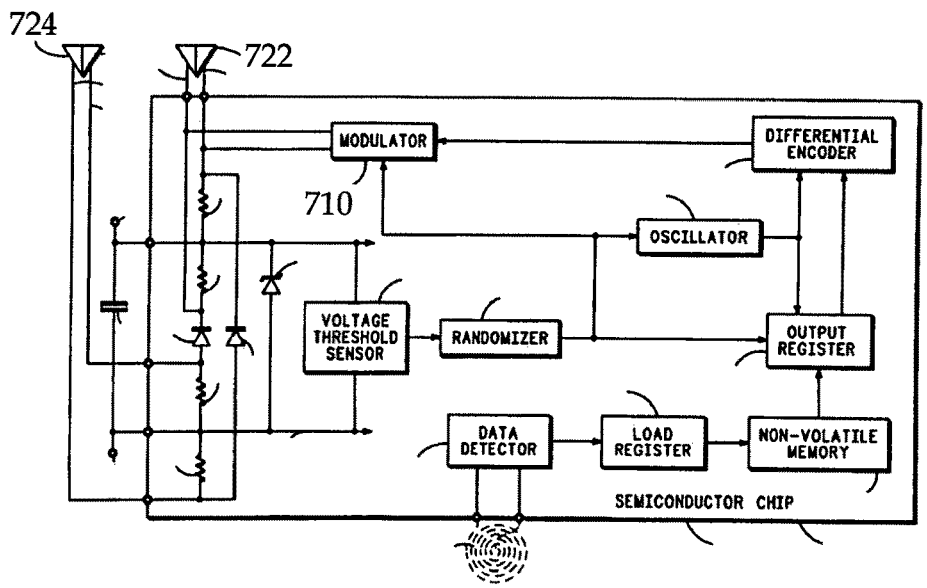
FIG. 7 shows a prior art block diagram of a single modulator RIFD tag circuit that controls two antennas.

FIG. 7 shows a diagram of a circuit 700 in the prior art, as described in U.S. Pat. No. 5,430,441. More particularly, FIG. 7 of the present document presents (coincidentally) FIG. 7 of U.S. Pat. No. 5,430,441, with some of its elements renumbered for consistency within this document.

In circuit 700, output nodes of a single modulator 710 couple to one or more of antennae 722 and 724. Modulator 710 modifies the RF impedance of antennae 722 and/or 724 in response to a code. As the impedance of antennae 722 and/or 724 changes, the amount of RF energy from a received interrogation signal away from tag of circuit 700 changes. An interrogator (not shown in this document) may then use conventional and reliable techniques to detect these changes.

While in the above a seemingly single modulator was used to couple to multiple antennas, that need not be the case. A modulator can be used for each antenna, as seen in the example below.

Figure 8:
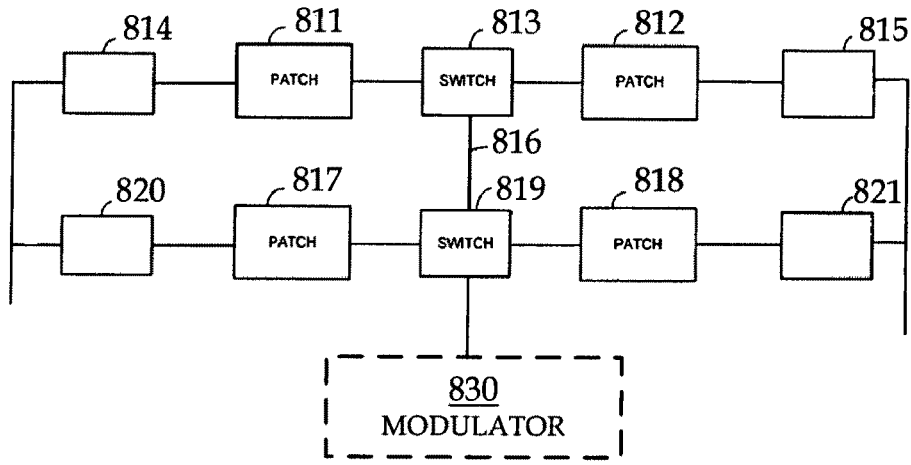
FIG. 8 shows a prior art diagram of a dual modulator circuit of an RFID tag circuit, where each modulator controls an antenna.

FIG. 8 shows a diagram of a dual modulator circuit 800 in the prior art, as described in U.S. Pat. No. 5,771,021. More particularly, FIG. 8 of the present document presents FIG. 3 of U.S. Pat. No. 5,771,021, along with showing in dashed lines a modulator appearing in the first drawing of that patent. The various elements have been renumbered for consistency with this document.

Generally, in circuit 800, the antennas are formed as pairs of conductive patches, connected and disconnected by switches. In particular, patches 811 and 812 are connected through switch 813. In addition, patches 817 and 818 are connected through switch 819. Patches 817 and 818 are preferably, but not necessarily, substantially the same as patches 811 and 812. Moreover, patches 811 and 812 are each one-half wavelength antennas, but other fractional wavelength antennas, such as one quarter wavelength antennas, may also be used.

In addition, multiple pairs of patches can be switched simultaneously in "gangs", each pair having its own switch. For example, switch 819 is controlled by the same modulating signal that controls switch 813 and is received through line 816, thus ensuring that both pairs of patches will be switched simultaneously. Moreover, detect devices 820, 821, 814 and 815 are associated with the patches. The use of multiple pairs of patches increases the signal power level of the antenna when all switches are in the open (off) position so as to produce a backscatter modulation pattern. As can be seen, switches 813, 819 act as extensions of a modulator 830, these extensions being individual to each antenna.

Figure 9A:
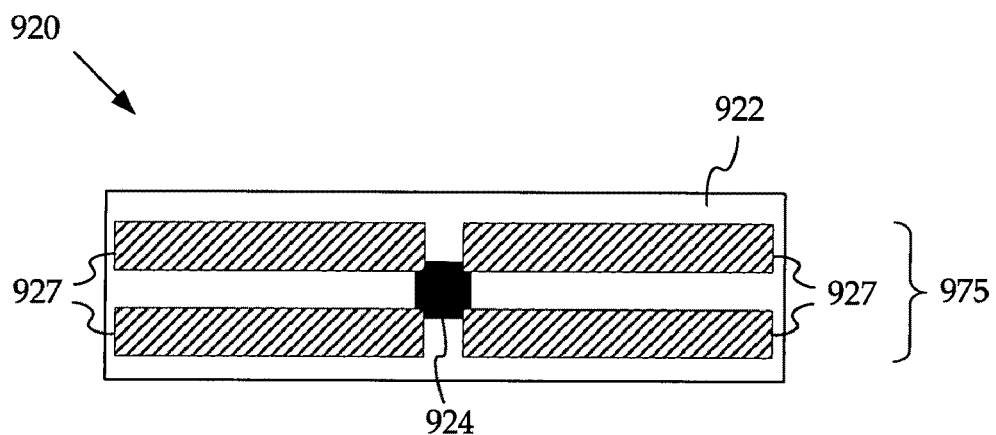
FIG. 9A is a diagram of an RFID tag with a chip that has two active and two ground ports according to various embodiments of the invention.

FIG. 9A is a diagram of an RFID tag 920 with a chip 924 that has two active and two ground ports according to various embodiments of the invention. The RFID tag 920, which can be the same as tag 120 of FIG. 1, may be implemented as a passive tag or an active tag. Tag 920 may be formed on a substantially planar inlay 922, which can be made in many ways known in the art. Tag 920 may include one or more electrical circuits, perhaps implemented as an IC chip 924. The IC chip 924 is arranged on, and perhaps attached to, the inlay 922.

The tag 920 also includes an antenna structure 975 for exchanging wireless signals with its environment. The antenna structure 975 may be laid out as a flat or substantially planar object, and attached to the inlay 922. The IC chip 924 may be electrically coupled to the antenna structure 975 via suitable antenna ports (not shown in this figure, but see FIG. 9B).

The antenna structure 975 may be fabricated in a number of ways well known in the art. In the example of FIG. 9A, the antenna structure 975 comprises four distinct antenna segments 927. Many other embodiments are possible, using any number of antenna segments.

In operation, a signal is received by the antenna structure 975, and communicated to the IC chip 924 which both harvests power (in passive form), and responds if appropriate, based on the incoming signal and its internal state. In order to respond, the IC chip 924 can modulate the impedance, and thus also the reflectance of the antenna structure 975. This modulating generates backscatter from a wave transmitted by an associated reader. Coupling together and uncoupling the antenna ports of the IC chip 924 can modulate the impedance, as can a variety of other means.

In the embodiment of FIG. 9A, the antenna segments 927 are shown as separate from the IC chip 924. In other embodiments, the antenna segments 927 may alternately be formed on the IC chip 924.

Figure 9B:
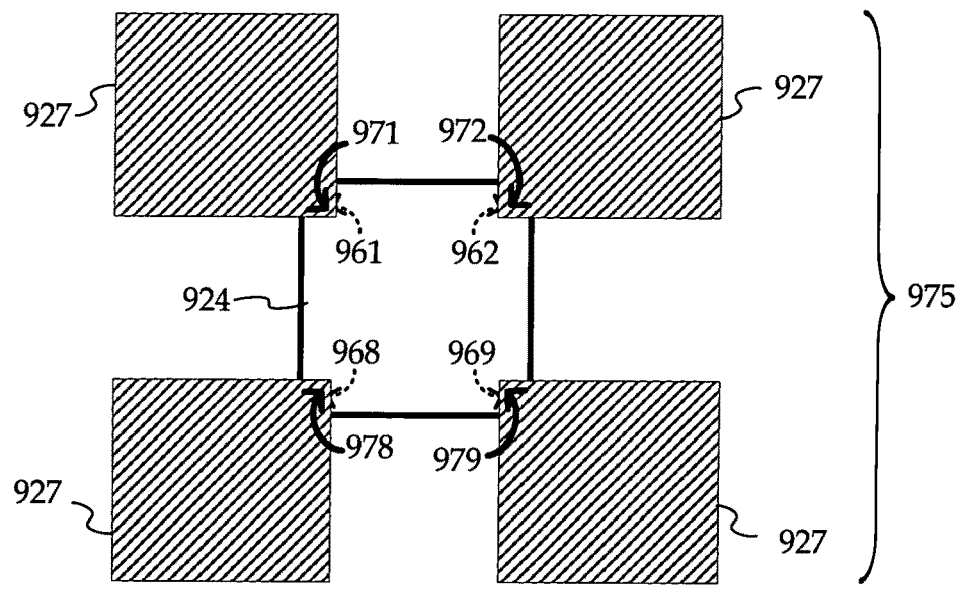
FIG. 9B is a detailed view of the chip shown in FIG. 9A, illustrating antenna structure coupled according to various embodiments of the invention.

FIG. 9B is a detailed view of the chip 924 shown in FIG. 9A, illustrating antenna structure 975 coupled according to various embodiments of the invention. Here it can be seen how the coupling ends 971, 972, 978, and 979 of the antenna structure 975 formed by the segments 927 are laid out to receive a chip 924 mounted on the antenna structure 975, so that the coupling ends 971, 972, 978, and 979 become electrically coupled to the ports or nodes 961, 962, 968, and 969 of the chip 924.

Chip 924 can have its ports or nodes 961, 962, 968, and 969 configured internally in any number of ways. In the embodiment shown, the chip 924 has two active ports or nodes 961, 962, and two ground ports or nodes 968, 969, for respective connections to antenna coupling ends 971, 972, 978, and 979. Additional ports or nodes may be fabricated on the chip 924.

Figure 10:
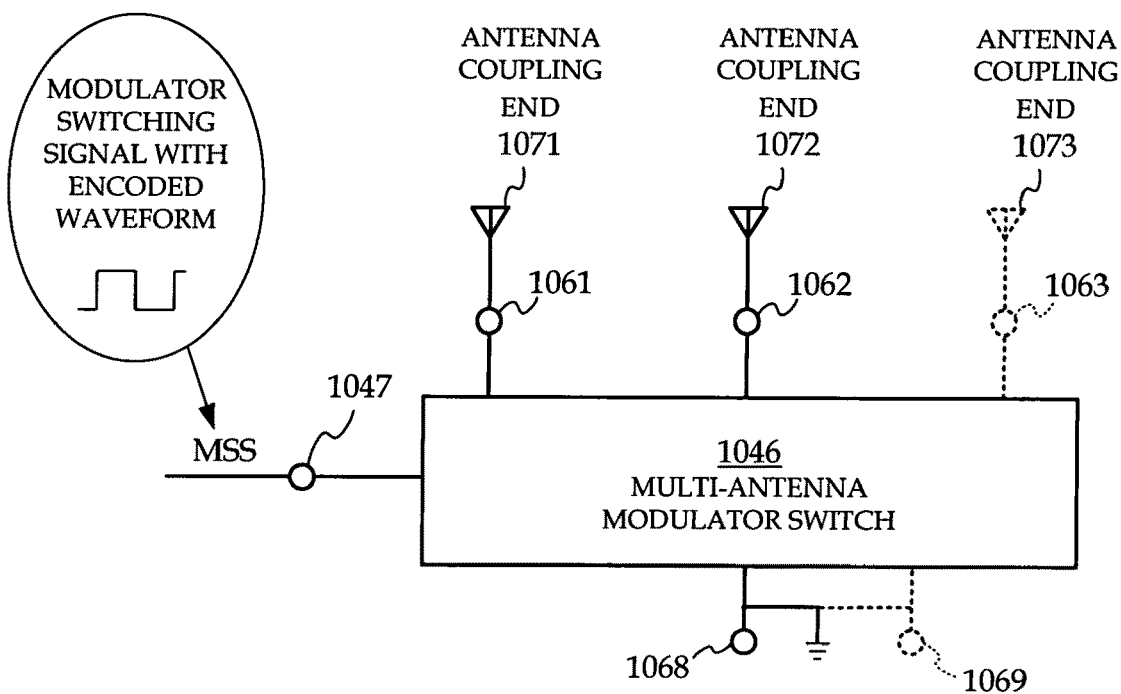
FIG. 10 is a block diagram showing electrical connections of a multi-antenna modulator switch for an RFID tag circuit according to various embodiments of the invention.

FIG. 10 is a block diagram showing electrical connections of a multi-antenna modulator switch 1046, also known as a multiple RF-port modulator, for an RFID tag circuit according to various embodiments of the invention. As shown in FIG. 10, the nodes 1061, 1062, 1068, and 1069 may correspond directly to the nodes 961, 962, 968, and 969 of FIG. 9B. Similarly, antenna coupling ends 1071 and 1072 may correspond directly to the coupling ends 971 and 972 of FIG. 9B. Additional coupling ends (e.g., coupling end 1073) may be electrically coupled to the multi-antenna modulator switch 1046 via additional ports or nodes (e.g., node 1063). The multi-antenna modulator switch 1046 can receive input signals, such as the modulator switching signal MSS with encoded waveform, at switching signal input 1047, to provide modulated signals at the nodes 1061, 1062, and 1063.

Figure 11:
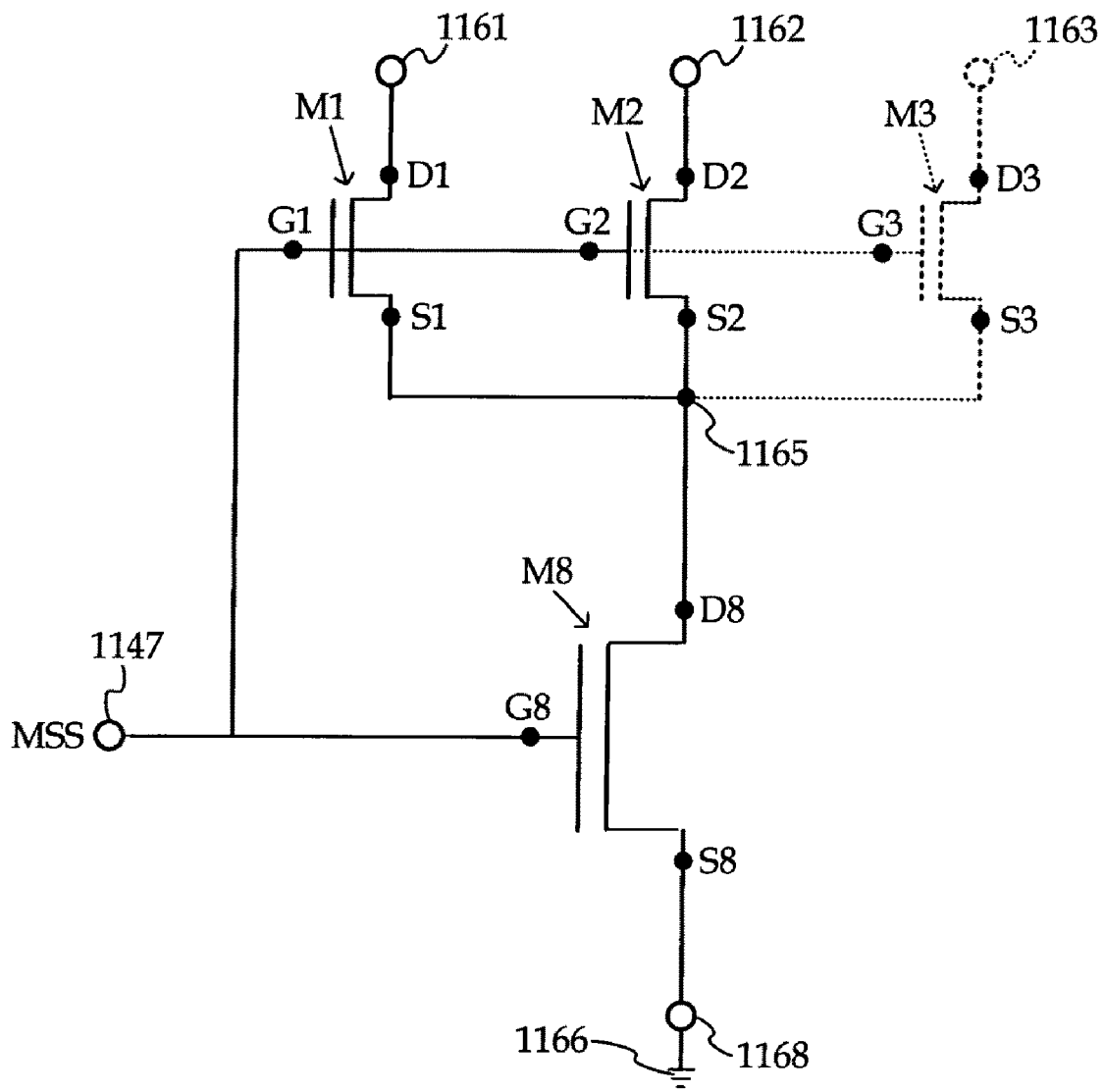
FIG. 11 is a schematic electrical diagram of a circuit for a modulator switch according to various embodiments of the switch of FIG. 10.

FIG. 11 is a schematic electrical diagram of a circuit for a modulator switch 1146 according to various embodiments of the switch 1046 of FIG. 10. The modulator switch 1146, like the switch 1046 of FIG. 10, may be formed as part of an IC chip (e.g., IC chip 924 of FIGS. 9A and 9B). The modulator switch 1146 can receive input signals, including a modulator switching signal MSS with an encoded waveform, at the switching signal input 1147.

Thus, by referring to FIGS. 9-11, it can be seen that some embodiments may include an integrated circuit chip 924 for use with an RFID tag 920 having an antenna structure 975 with at least three coupling ends 971, 972, 978 for mounting on the chip 924. The chip 924, in turn, may comprise three or more nodes 961, 962, 968 (as well as 1061, 1062, 1068 and 1161, 1162, 1168) corresponding respectively to the coupling ends 971, 972, 978.

Figure 14:
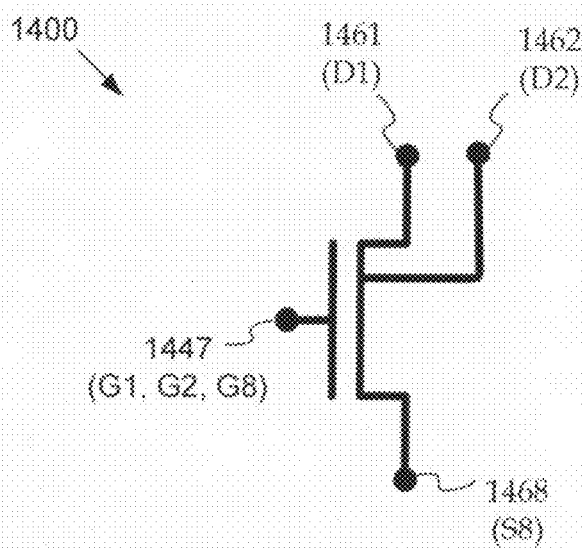
FIG. 14 is schematic diagram of a device having electrical behavior similar to that of the switch shown in FIG. 10.

The chip 924 may also comprise a modulator switch 1046, 1146 including three or more transistors M1, M2, and M8. The first antenna transistor M1 may have a first switching terminal D1 coupled to a first one 1161 of the nodes, a fourth switching terminal S1, and a first gate terminal G1. The second antenna transistor M2 may have a second switching terminal D2 coupled to a second one 1162 of the nodes, a fifth switching terminal S2, and a second gate terminal G2. A common transistor M8 may have a third switching terminal D8 coupled to the fourth and fifth switching terminals S1, S2, a sixth switching terminal S8 coupled to a third one 1168 of the nodes, and a third gate terminal G8 coupled to the first and second gate terminals G1, G2. In some embodiments, the first antenna transistor M1, the second antenna transistor M2, and the common transistor M8 may be formed as a single device (a schematic for such a device is shown in FIG. 14).

A number of configurations may be useful, depending on the particular design implemented. For example, the first switching terminal S1 may comprise a drain, while the third switching terminal D8 comprises a source. In other cases, the third switching terminal D8 may comprise a drain, while the sixth switching terminal S8 comprises a source. Other configurations may be used.

The modulator switch 1046, 1146 may include additional transistors, perhaps coupled to additional ports or nodes. For example, the modulator switch 1046, 1146 may comprise a third antenna transistor M3 having a seventh switching terminal D3 coupled to a fourth one 1163 of the nodes, an eighth switching terminal S3 coupled to the third, fourth, and fifth switching terminals S1, S2, D8, and a fourth gate terminal G3 coupled to the first, second, and third gate terminals G1, G2, G8. The modulator switch 1046, 1146 may comprise a grounded antenna terminal 1166 to couple to the third one 1168 of the nodes.

In some embodiments, an RFID tag 920 may comprise an inlay 922, and an antenna structure 975 on the inlay 922 that has three or more coupling ends 971, 972, 978 and 979 (as well as 1071, 1072, 1073). The tag 920 may also comprise a circuit 1046, 1146 for driving the antenna structure 975 from the coupling ends 971, 972, 978 and 979. The circuit 1046, 1146 may comprise any of the elements shown in FIGS. 10-11, as described above.

Figure 12:
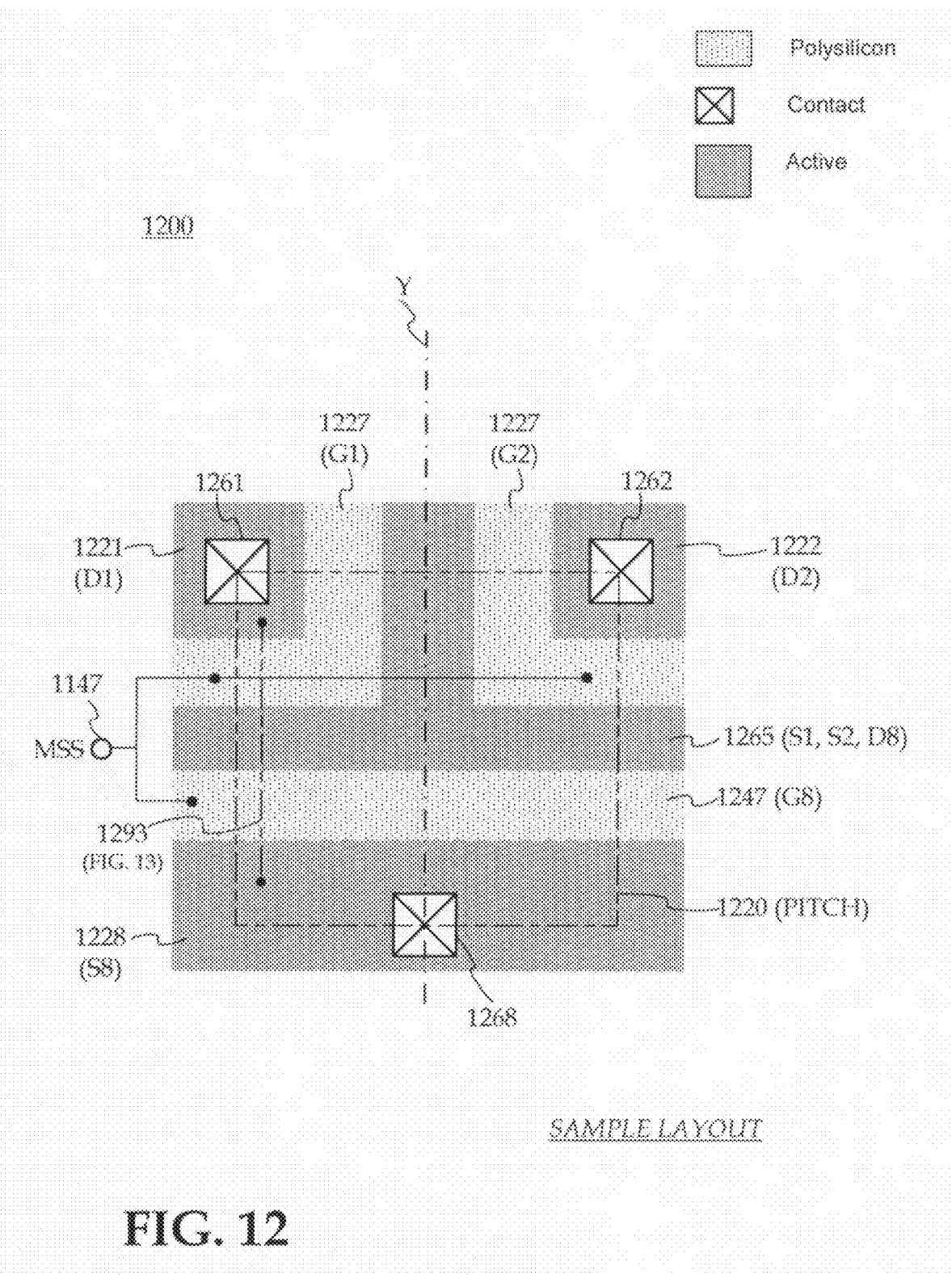
FIG. 12 is a top view of the switch of FIG. 10, implemented as a portion of an IC device, according to various embodiments of the invention.

FIG. 12 is a top view of the switch of FIG. 10, implemented as a portion of an IC device 1200, according to various embodiments of the invention. The electrical behavior of the IC device 1200 can be modeled using the circuit 1146 shown in FIG. 11. Thus, device 1200 can receive input signals, including a modulator switching signal MSS with an encoded waveform, at the switching signal input 1147. The diffusion coupling areas 1221, 1222, 1228 correspond to the switching terminals D1, D2, S8, respectively, of FIG. 11. The contacts 1261, 1262, 1268, which may comprise metal contacts, correspond to the nodes 1161, 1162, 1168, respectively, of FIG. 11. The common diffusion area 1265 corresponds to the common connection or coupling point 1165 of switching terminals S1, S2, and D8 in FIG. 11. Here, the common diffusion area 1265 is formed as a single-axis mirrored channel (mirrored about the Y axis).

As shown, the diffusion coupling areas 1221, 1222 may be configured as drains, while the third diffusion coupling area 1228 is configured as a source. Equivalently, the diffusion coupling areas 1221, 1222 may be configured as sources, while the third diffusion coupling area 1228 is configured as a drain.

The three gating areas 1227 (labeled twice) and 1247 correspond to the gate terminals G1, G2 and G8, respectively. The gating areas 1227, 1247 may be selectively coupled together (e.g., gating area G1 may be coupled to gating area G2 and/or gating area G8) using metal interconnects to polysilicon contacts, or using a polysilicon area outside the active area (e.g., depositing polysilicon outside the diffusion coupling areas 1221, 1222, 1228 and the common diffusion area 1265).

Figure 13:
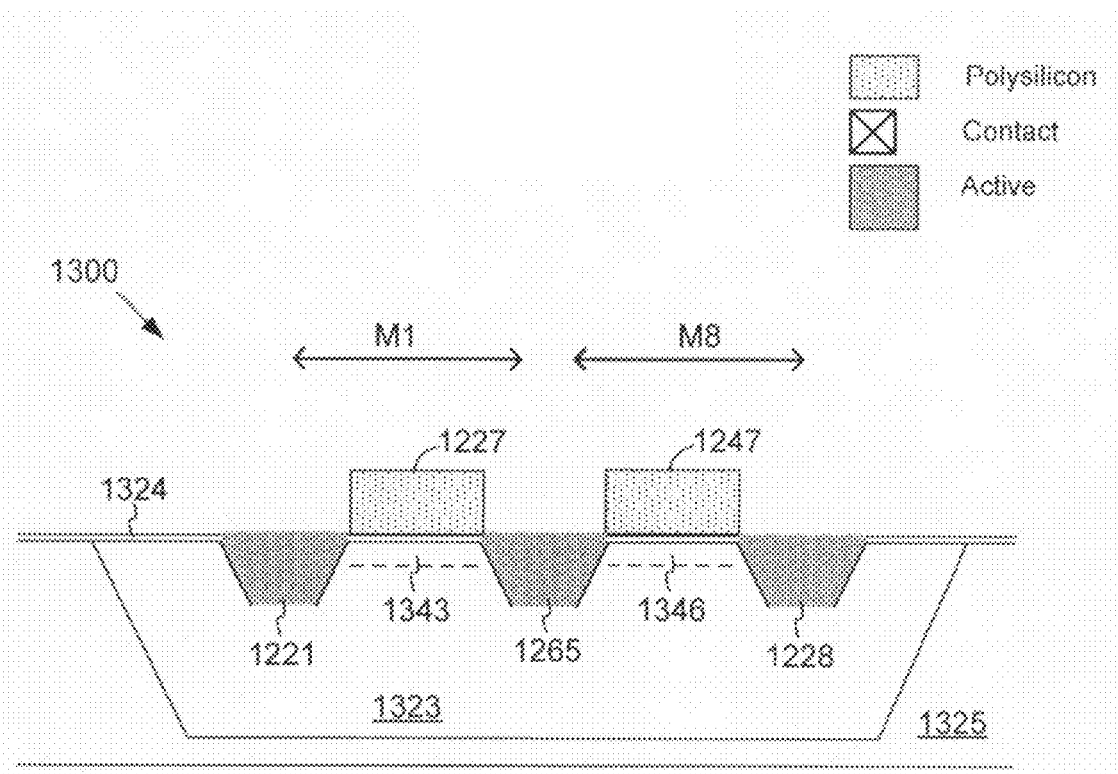
FIG. 13 shows a cross section view of an IC device, taken along a line segment of the layout of FIG. 12.

FIG. 13 shows a cross section view of an IC device 1300, taken along a line segment 1293 of the top view layout of FIG. 12. Thus, IC device 1300 may be similar to or identical to the IC device 1200 of FIG. 12. By referring to FIGS. 12 and 13, it can be seen that there is no easy straightforward way to "slice" through the integrated devices 1200, 1300 as formed on the substrate 1323 to separate the functions of the transistors M1, M2, and M8.

It will be recognized that device 1300 shows two FETs, one for transistor M1 and one for transistor M8. Device 1300 can be made within a well 1323 of a semiconductor substrate 1325 such as silicon. Alternately, there is no well 1323 and the device is formed directly on the substrate 1325. An insulating oxide layer 1324 can be formed on the substrate 1325 or above well 1323.

Thus, the common diffusion area 1265 may be formed as a diffusion of a first conductivity type in the well 1323, which would be of a second conductivity type. The first conductivity type, as well as the second conductivity type, may comprise one of an n type and a p type, at appropriate concentrations.

For transistor M1, a channel 1343 is formed between doped diffusion areas 1221 and 1265. Gate 1227 is formed by a layer of polysilicon on oxide layer 1324, and over channel 1343.

For transistor M8, a channel 1346 is formed between doped diffusion areas 1265 and 1228. Gate 1247 is formed by a layer of polysilicon on oxide layer 1324, and over channel 1346.

Doped diffusion areas 1221, 1228, and 1265 are doped as needed. It will be observed that area 1265 is common for both transistors M1 and M8. Device 1300 also includes other items that are not shown, but will be evident to a person of ordinary skill in the art, such as contacts for antenna coupling ends, for biasing wells, etc.

FIG. 14 is a schematic diagram of a device 1400 having electrical behavior similar to that of the switch 1046 shown in FIG. 10. The integral construction of the devices 1200, 1300 shown in FIGS. 12 and 13, respectively, is aptly conveyed by the unitary structure of the device 1400. That is, the activity of signals present at multiple nodes (coupled to switching terminals), such as nodes 1461, 1462, 1468 can be governed by a single input signal, such as modulator switching signal MSS, at the switching signal input 1447.

Figure 15:
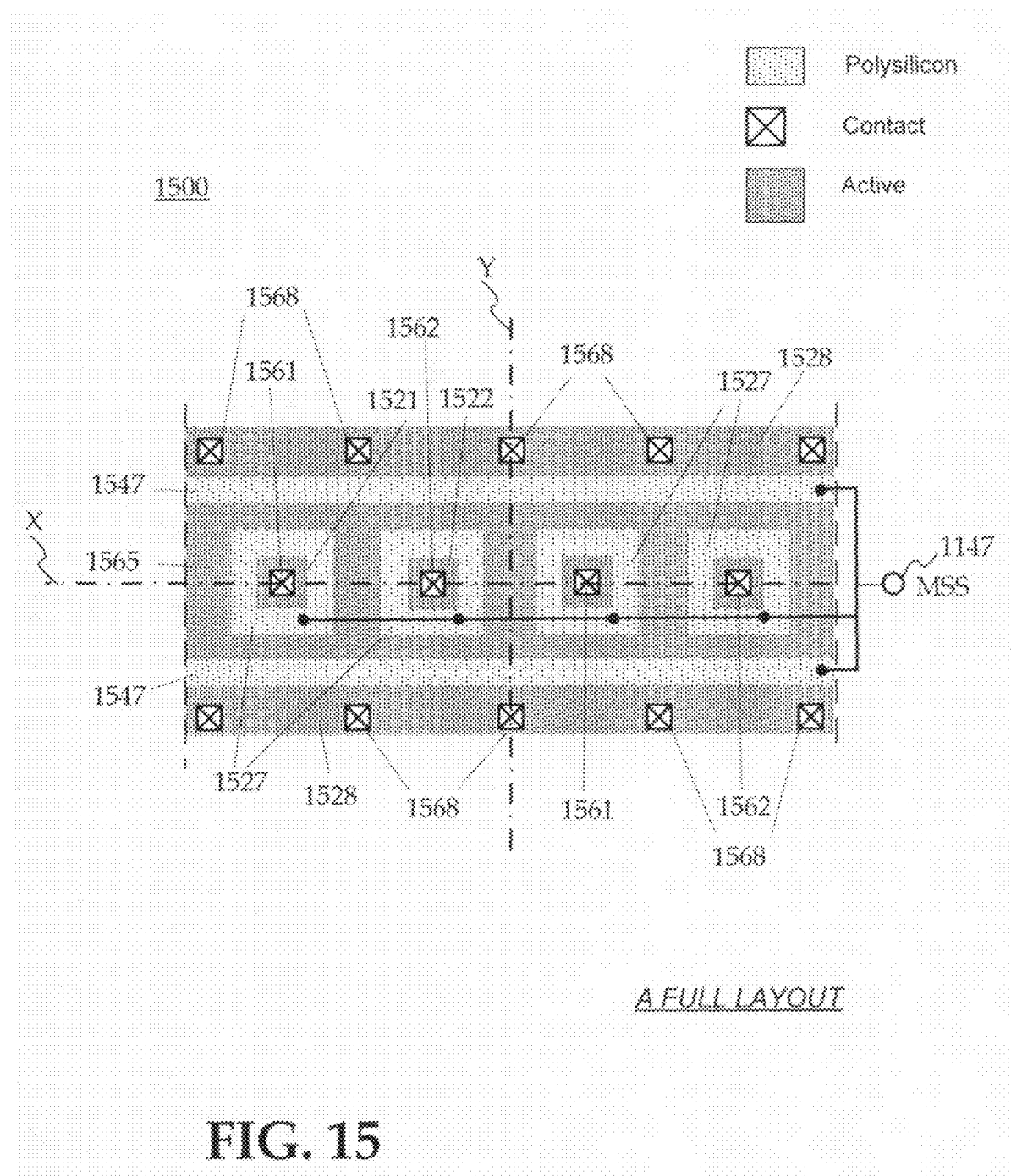
FIG. 15 is a top view of the switch of FIG. 10, implemented as an IC device, formed by tiling a pitch of the layout of FIG. 12.

FIG. 15 is a top view of the switch of FIG. 10, implemented as an IC device 1500, formed by tiling a pitch 1220 of the layout of FIG. 12. This device 1500 illustrates one arrangement of how it is physically possible to include multiple nodes 1561, 1562, 1568 (coupled to switching terminals) in a single device. Here, four active nodes (coupled to contacts or nodes 1561, 1562, corresponding to the nodes 1261, 1262 of FIG. 12) responsive to a single switching signal input 1147 are shown. The diffusion areas 1528, 1565 correspond to the diffusion areas 1228, 1265, respectively, of FIG. 12, and the common diffusion area 1565 is formed as a dual-axis mirrored channel (mirrored about the X and Y axes). The gating areas 1527, 1547 correspond to the gating areas 1227, 1247, respectively, of FIG. 12.

Thus, referring now to FIGS. 12, 13, and 15, it can be seen that some embodiments may include a semiconductor device 1200, 1300, 1500 for use with an RFID tag having an antenna structure with at least three coupling ends. The device 1200, 1300, 1500 may comprise a substrate 1325 having at least three diffusion coupling areas 1221, 1222, 1228, 1521, 1522, 1528 formed thereon for coupling respectively to the at least three coupling ends. The device 1200, 1300, 1500 may also comprise a common diffusion area 1265, 1565 formed on the substrate 1325 so as to separate a first one 1221, 1521 of the diffusion coupling areas from a second one 1222, 1522 of the diffusion coupling areas and a third one 1228, 1528 of the diffusion coupling areas.

The device 1200, 1300, 1500 may also comprise several gating areas, such as first and second gating areas 1227 (G1 and G2), 1527 separating first and second ones 1221, 1222, 1521, 1522 of the diffusion coupling areas from the common diffusion area 1265, 1565, respectively. The device 1200, 1300, 1500 may also comprise a third gating area 1247 (G8) separating a third one 1228, 1528 of the diffusion coupling areas from the common diffusion area 1264, 1565. As noted with respect to FIG. 12, any and all of the gating areas 1227, 1247, 1527, 1547 may be selectively coupled together using metal interconnects to polysilicon contacts, or using a polysilicon area deposited outside the active area.

Given the novel construction of the device 1200, 1300, 1500, many fabrication options are available. For example, the diffusion coupling areas 1221, 1222, 1228, 1521, 1522, 1528 and the common diffusion area 1265, 1565 may be formed from a single diffusion layer. The single diffusion layer may comprise a first conductivity type on a substrate of a second conductivity type. The first conductivity type may comprise one of an n type and a p type, and the second conductivity type may correspondingly comprise one of a p type and an n type, and vice versa. The first and second diffusion coupling areas (e.g., 1221, 1222, 1521, 1522) may be configured as sources, while the third diffusion coupling area (e.g., 1228, 1528) may be configured as a drain. Similarly, the first and second diffusion coupling areas (e.g., 1221, 1222, 1521, 1522) may be configured as drains, while the third diffusion coupling area (e.g., 1228, 1528) is configured as a source.

In the above, it should be noted that the resulting semiconductor device 1200, 1300, 1500 has three diffusion coupling areas (1221, 1222, 1228, 1521, 1522, 1528), which are intended for ultimate coupling with an antenna structure. The common diffusion area 1265, 1565 separates the three diffusion coupling areas (1221, 1222, 1228, 1521, 1522, 1528) from each other.

The first gating area 1527 is located between the first diffusion coupling area 1521 and the common diffusion area 1565. In this particular embodiment, the first gating area 1527 completely surrounds the first diffusion coupling area 1521, and has the shape of a square.

The second gating area is coupled to the first gating area 1527, which is why both gating areas are designated by the numeral 1527. The second gating area is located between the second diffusion coupling area 1522 and the common diffusion area 1565. In this particular embodiment, the second gating area 1527 completely surrounds the second diffusion coupling area 1522, and has the shape of a square.

The third gating area 1547 is located between the third diffusion coupling area 1528 and the common diffusion area 1565. In some embodiments, the third gating area 1547 is coupled with the first gating area 1527, and thus also the second gating area.

Numerous embodiments may be constructed. For example, the common diffusion area 1265, 1565 may be formed as a single-axis mirrored channel (see FIGS. 12 and 15). The common diffusion area 1565 may also be formed as a dual-axis mirrored channel (see FIG. 15), e.g. around axes X, Y.

Various embodiments of the invention include methods. An economy is achieved in the present document in that a single set of flowcharts is used to describe methods in and of themselves, along with operations of hardware and/or software. This is regardless of how each element is implemented. Several methods are now described more particularly according to various embodiments.

Figure 16:
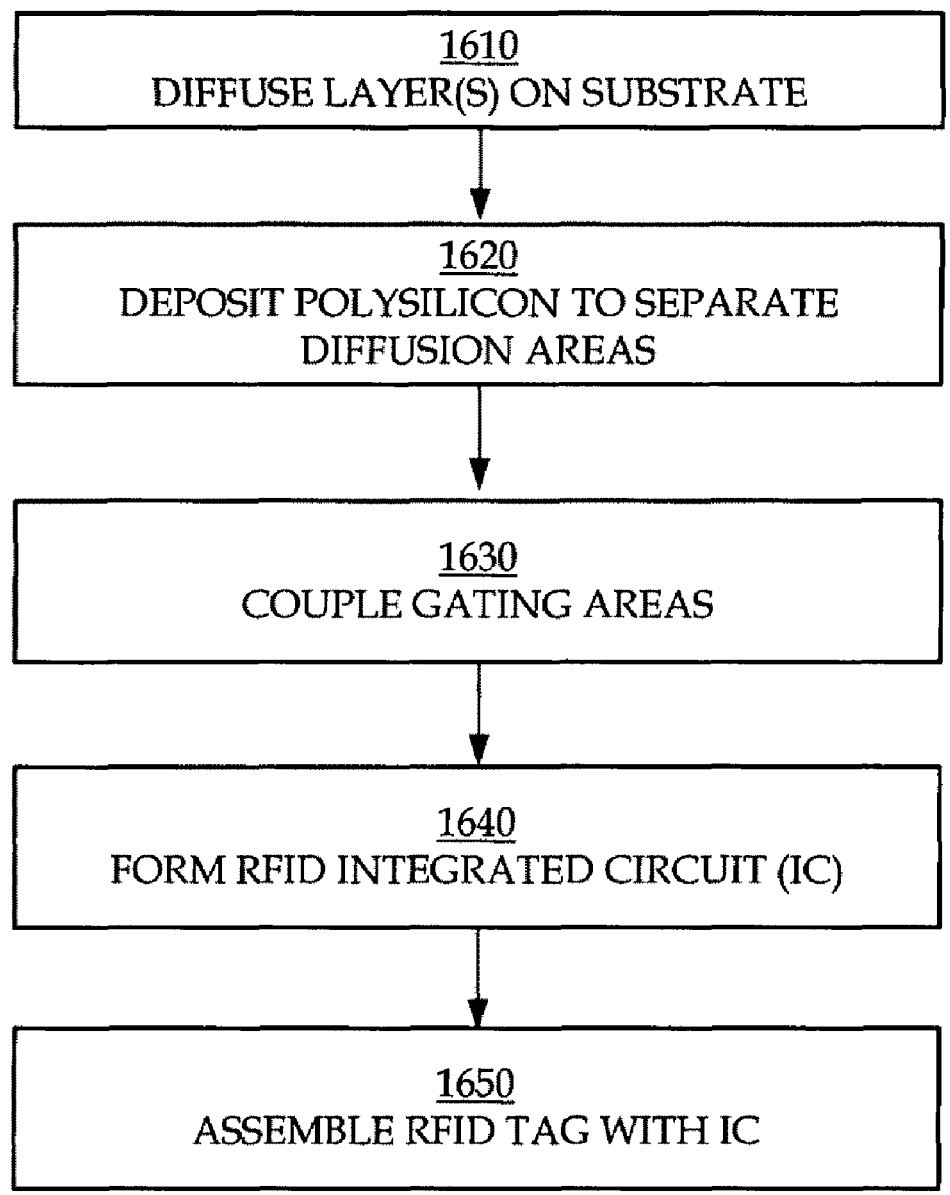
FIG. 16 is a flowchart illustrating methods of fabricating a distributed modulator and other devices according to various embodiments of the invention.

FIG. 16 is a flowchart illustrating methods 1600 of fabricating a distributed modulator and other devices according to various embodiments of the invention. Thus, it can be seen that in some embodiments a method 1600 may begin at block 1610 with diffusing a layer of a first conductivity type into a substrate of a second conductivity type to form a common diffusion area and at least three diffusion coupling areas (as shown in FIGS. 12, 13, and 15).

The method 1600 may continue at block 1620 with depositing a layer of polysilicon on the layer of the first conductivity type to separate the common diffusion area and the at least three diffusion coupling areas by establishing gating areas comprising a single modulation source input adjacent the at least three diffusion coupling areas. Thus, the method 1600 may include forming the gating areas on opposite sides of the common diffusion area.

In accordance with the myriad options available for construction, two will be named here. First, the method 1600 may include forming a first portion of the at least three diffusion coupling areas as a pair of field-effect transistor drains, and a second portion of the at least three diffusion coupling areas as a field-effect transistor source. Similarly, the method 1600 may include forming a first portion of the at least three diffusion coupling areas as a pair of field-effect transistor sources, and a second portion of the at least three diffusion coupling areas as a field-effect transistor drain.

The method 1600 may include, at block 1630, forming interconnects, such as metal interconnects, to couple the gating areas together. The method 1600 may also include depositing polysilicon outside of the common diffusion area to couple the gating areas together.

The method 1600 may include, at block 1640, depositing the layer of polysilicon over oxide as a portion of an RFID circuit. The method 1600 may also include, at block 1650, assembling the RFID circuit into an RFID tag.

The electrical circuits described in this document can be manufactured in any number of ways, as will be appreciated by the persons skilled in the art. One such way is in the form of one or more integrated circuits.

Schematic-type inputs can be provided for the purpose of preparing one or more layouts. These inputs can include only the schematic of a circuit, or much more information, such as the relative sizes of circuit components, and the like, as may be appreciated by those of ordinary skill in the art of providing such inputs. These inputs can be provided in any suitable way, such as using a written document, or electronically, as computer files and the like. Some of these computer files can be prepared with the assistance of suitable design tools, which often include instrumentalities for simulating circuit behaviors and the like.

These inputs can be provided to a person of ordinary skill in the art of preparing layouts. This may occur whether the person is within the same company, or another company, such as under a contract. A layout can be prepared that embodies the schematic-type inputs by one of ordinary skill in the art. The layout itself may be prepared as a computer file, so that it can easily be checked for errors, modified as needed, and so on.

Layout computer files can be made to form portions of larger layout computer files. For example, suitable individual designs can be assembled for the electrical components and circuits indicated in the schematic-type inputs. The individual designs can be generated anew, or selected from existing libraries. In the layout phase, the assembled designs can be arranged to interoperate, so as to implement one or more integrated circuits comprising the electrical circuits of the provided schematic-type inputs. These computer files can be stored in storage media, such as memories, whether portable or not, and the like.

Then a special type of computer file can be synthesized from the prepared layout, in a manner that incorporates the prepared layout, which has the embodied schematic-type inputs. Such files are known in the industry as IC chip design files or tapeout files, and these embody instructions for machinery directing how to process a semiconductor wafer so as to produce an integrated circuit that is arranged as in the incorporated layout.

The synthesized tapeout file may be transferred to a semiconductor manufacturing plant, which is also known as a foundry, and so on. Transferring can occur using any suitable means, such as over an electronic network. Tapeout files can also be recorded in a storage medium, which in turn is physically shipped to the mask manufacturer.

The received tapeout file may be used by mask making machinery as instructions for processing a semiconductor wafer. The wafer, as thus processed, now has one or more integrated circuits, each made according to the layout incorporated in the tapeout file. If more than one integrated circuit is included in the wafer, then the wafer can be diced to separate them, and so on.

Thus, additional embodiments may be realized. For example, a method may comprise providing schematic-type inputs for the purpose of preparing a layout that embodies the schematic-type inputs, in which, if the layout is incorporated in a tapeout file that is used by mask making machinery as instructions for processing a semiconductor wafer, one or more integrated circuits will result on the wafer according to the schematic-type inputs.

The integrated circuits resulting on the wafer may each comprise any one or more of the component elements described with respect to the integrated circuit chips 224 and 924 of FIGS. 2 and 9, as well as the circuits illustrated in FIGS. 10-15. In some embodiments, the method may comprise preparing the layout that embodies the provided schematic type inputs, synthesizing a tapeout file that incorporates the prepared layout to provide a synthesized tapeout file, and operating mask making machinery according to the synthesized tapeout file.

It should be noted that the methods described herein can be implemented in any number of ways, including via the structures described in this document. One such way is by machine operations, using devices of the type described in this document. Another optional way is for one or more of the individual operations of the methods to be performed in conjunction with one or more human operators performing others. These human operators need not be collocated with each other, but each may be located separately, along with one or more machines that perform a portion of the operations described.

In addition, it should be noted that the methods described herein do not have to be executed in the order described, or in any particular order. Moreover, various activities described with respect to the methods identified herein can be executed in iterative, repetitive, serial, or parallel fashion. Information, including parameters, commands, operands, and other data, can be sent and received in the form of one or more carrier waves.

Upon reading and comprehending the content of this disclosure, one of ordinary skill in the art will understand the manner in which a software program can be launched from a computer-readable medium in a computer-based system to execute the functions defined in the software program. One of ordinary skill in the art will further understand the various programming languages that may be employed to create one or more software programs designed to implement and perform the methods disclosed herein. The programs may be structured in an object-orientated format using an object-oriented language such as Java or C++. Alternatively, the programs can be structured in a procedure-orientated format using a procedural language, such as assembly or C. The software components may communicate using any of a number of mechanisms well known to those skilled in the art, such as application program interfaces or interprocess communication techniques, including remote procedure calls. The teachings of various embodiments are not limited to any particular programming language or environment.

Thus, other embodiments may be realized. For example, an article of manufacture, such as a computer, a memory system, a magnetic or optical disk, some other storage device, an RFID reader, an RFID tag, and/or any type of electronic device or system may include a processor coupled to a machine-accessible medium such as a memory (e.g., removable storage media, as well as any memory including an electrical, optical, or electromagnetic conductor) having associated information (e.g., computer program instructions and/or data), which when accessed, results in a machine (e.g., the processor) performing any of the actions described with respect to the methods above.

Thus, in some embodiments, an article may comprise a machine-readable memory containing thereon instructions which, if executed by mask making machinery as instructions for processing a semiconductor wafer, result in an integrated circuit on the wafer. The integrated circuits resulting on the wafer may each comprise any one or more of the component elements described with respect to the integrated circuit chips 224 and 924 of FIGS. 2 and 9, as well as the circuits illustrated in FIGS. 10-15.

Implementing the circuits and methods disclosed herein may provide an improved, low-cost mechanism for using multiple antennas to reduce orientation sensitivity in RFID tags, thus improving overall system robustness.

The accompanying drawings that form a part hereof, show by way of illustration, and not of limitation, specific embodiments in which the subject matter may be practiced. The architecture of the system is presented for purposes of explanation, and not of limitation. Its particular subdivision into modules need not be followed for creating embodiments according to the invention. Furthermore, the features of the invention can be performed either within a single one of the modules, or by a combination of them. An economy is achieved by using a single set of flowcharts to describe methods in and of themselves, along with operations of hardware and/or software. This is regardless of how each element is implemented.

The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

In this description, numerous specific details such as logic implementations, opcodes, means to specify operands, resource partitioning, sharing, and duplication implementations, types and interrelationships of system components, and logic partitioning/integration choices are set forth in order to provide a more thorough understanding of various embodiments. It will be appreciated, however, by those of ordinary skill in the art that embodiments of the invention may be practiced without such specific details. In other instances, control structures, gate level circuits, and full software instruction sequences have not been shown in detail so as not to obscure the embodiments of the invention.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A semiconductor device for use with a Radio Frequency Identification (RFID) tag having an antenna structure with at least three coupling ends, the device comprising:
   a substrate having at least three diffusion coupling areas formed thereon for coupling respectively to the at least three coupling ends;
   a common diffusion area formed on the substrate so as to separate the three diffusion coupling areas from each other;
   a first gating area between a first one of the diffusion coupling areas and the common diffusion area;
   a second gating area between the common diffusion area and a second one of the diffusion coupling areas, the second gating area coupled to the first gating area; and
   a third gating area between the common diffusion area and a third one of the diffusion coupling areas.

2. The semiconductor device of claim 1, wherein the third gating area is coupled to the first gating area.

3. The semiconductor device of claim 2, wherein the common diffusion area is formed as a diffusion of a first conductivity type in a well of a second conductivity type.

4. The semiconductor device of claim 1, wherein the first and the second diffusion coupling areas are configured as sources, and the third diffusion coupling area is configured as a drain.

5. The semiconductor device of claim 1, wherein the first and the second diffusion coupling areas are configured as drains, and the third diffusion coupling area is configured as a source.

6. The semiconductor device of claim 1, wherein the common diffusion area is formed as a single-axis mirrored channel.

7. The semiconductor device of claim 1, wherein the common diffusion area is formed as a dual-axis mirrored channel.

8. The semiconductor device of claim 1, wherein the first gating area completely surrounds the first diffusion coupling area.

9. The semiconductor device of claim 8, wherein the first gating area has the shape of a square.

10. The semiconductor device of claim 8, wherein the second gating area completely surrounds the second diffusion coupling area.

11. The semiconductor device of claim 10, wherein the second gating area has the shape of a square.

12. A method, comprising:
   diffusing a layer of a first conductivity type into a substrate of a second conductivity type to form a common diffusion area and at least three diffusion coupling areas; and
   depositing a layer of polysilicon on the layer of the first conductivity type to separate the common diffusion area and the at least three diffusion coupling areas by establishing gating areas comprising a single modulation source input adjacent the at least three diffusion coupling areas.

13. The method of claim 12, comprising:
forming metal interconnects to couple the gating areas together.

14. The method of claim 12, comprising:
depositing polysilicon outside of the common diffusion area to couple the gating areas together.

15. The method of claim 12, comprising:
depositing the layer of polysilicon as a portion of a radio-frequency identification (RFID) circuit.

16. The method of claim 15, comprising:
assembling the RFID circuit into an RFID tag.

17. The method of claim 12, comprising:
forming a first portion of the at least three diffusion coupling areas as a pair of field-effect transistor drains, and a second portion of the at least three diffusion coupling areas as a field-effect transistor source.

18. The method of claim 12, comprising:
forming a first portion of the at least three diffusion coupling areas as a pair of field-effect transistor sources, and a second portion of the at least three diffusion coupling areas as a field-effect transistor drain.

19. The method of claim 12, comprising:
forming the gating areas on opposite sides of the common diffusion area.

* * * * *

UNITED STATES PATENT AND TRADEMARK OFFICE
CERTIFICATE OF CORRECTION

| | | |
|---|---|---|
| PATENT NO. | : 7,616,120 B1 | Page 1 of 1 |
| APPLICATION NO. | : 11/712759 | |
| DATED | : November 10, 2009 | |
| INVENTOR(S) | : Humes et al. | |

It is certified that error appears in the above-identified patent and that said Letters Patent is hereby corrected as shown below:

1) Please delete "RIFD" on page 3, column 2, line 17 and insert --RFID--, therefor.

2) Please delete "10" on page 4, column 3, line 4 and insert --110--, therefor.

Signed and Sealed this

Twelfth Day of January, 2010

David J. Kappos
*Director of the United States Patent and Trademark Office*